(12) United States Patent
Kunimoto

(10) Patent No.: US 10,871,581 B2
(45) Date of Patent: Dec. 22, 2020

(54) SCINTILLATOR MODULE, SCINTILLATOR SENSOR UNIT, AND SCINTILLATOR MODULE PRODUCTION METHOD

(71) Applicant: YASU MEDICAL IMAGING TECHNOLOGY CO., LTD., Yasu (JP)

(72) Inventor: Fumiaki Kunimoto, Shiga (JP)

(73) Assignee: YASU MEDICAL IMAGING TECHNOLOGY CO., LTD., Yasu (JP)

( * ) Notice: Subject to any disclaimer, the term of this patent is extended or adjusted under 35 U.S.C. 154(b) by 0 days.

(21) Appl. No.: 16/478,033

(22) PCT Filed: Feb. 17, 2017

(86) PCT No.: PCT/JP2017/005831
§ 371 (c)(1),
(2) Date: Jul. 15, 2019

(87) PCT Pub. No.: WO2018/150529
PCT Pub. Date: Aug. 23, 2018

(65) Prior Publication Data
US 2019/0369270 A1 Dec. 5, 2019

(51) Int. Cl.
*G01T 1/20* (2006.01)
*H01L 27/146* (2006.01)

(52) U.S. Cl.
CPC ...... *G01T 1/2006* (2013.01); *H01L 27/14663* (2013.01); *H01L 27/14685* (2013.01)

(58) Field of Classification Search
CPC . G01T 1/2006; G01T 1/202; H01L 27/14663; H01L 27/14685; G21K 4/00
See application file for complete search history.

(56) References Cited

U.S. PATENT DOCUMENTS

| | | |
|---|---|---|
| 2002/0192471 A1 | 12/2002 | Homme et al. |
| 2005/0077473 A1 | 4/2005 | Homme et al. |
| 2007/0257198 A1 | 11/2007 | Ogawa et al. |
| 2008/0302970 A1 | 12/2008 | Fujieda et al. |
| 2011/0155917 A1 | 6/2011 | Nomura et al. |

(Continued)

FOREIGN PATENT DOCUMENTS

| | | |
|---|---|---|
| CN | 101002110 A | 7/2007 |
| CN | 101900824 A | 12/2010 |

(Continued)

OTHER PUBLICATIONS

International Search Report dated May 23, 2017, in PCT/JP2017/005831 filed on Feb. 17, 2017.

(Continued)

*Primary Examiner* — Anthony Ho
(74) *Attorney, Agent, or Firm* — Oblon, McClelland, Maier & Neustadt, L.L.P.

(57) ABSTRACT

According to an embodiment, a scintillator module includes a moisture-proof welding layer and a resin case. The moisture-proof welding layer is formed of a material having a welding property and a moisture-proof property, and extends to a side surface of a fiber optic plate to cover, in a sealed state, a scintillator layer and a visible-light reflective layer laminated on the fiber optic plate. The resin case covers the moisture-proof welding layer while being pressed against the side surface of the fiber optic plate.

8 Claims, 4 Drawing Sheets

(56) References Cited

U.S. PATENT DOCUMENTS

| | | |
|---|---|---|
| 2012/0187299 A1 | 7/2012 | Nagano et al. |
| 2012/0217404 A1 | 8/2012 | Iwakiri et al. |
| 2012/0223237 A1 | 9/2012 | Takeda et al. |
| 2012/0223240 A1 | 9/2012 | Ichimura et al. |
| 2015/0060678 A1 | 3/2015 | Watano |

FOREIGN PATENT DOCUMENTS

| | | |
|---|---|---|
| CN | 102110698 A | 6/2011 |
| CN | 102610292 A | 7/2012 |
| CN | 102650697 A | 8/2012 |
| CN | 102654583 A | 9/2012 |
| CN | 102655160 A | 9/2012 |
| JP | 2002-116258 A | 4/2002 |
| JP | 2003-98299 A | 4/2003 |
| JP | 2004-294137 A | 10/2004 |
| JP | 2005-114397 A | 4/2005 |
| JP | 2006-52984 A | 2/2006 |
| JP | 2008-215951 A | 9/2008 |
| JP | 2014-153074 A | 8/2014 |
| JP | 2015-45615 A | 3/2015 |
| JP | 2016-95189 A | 5/2016 |
| JP | 2016-136094 A | 7/2016 |

OTHER PUBLICATIONS

Notification of Reason for Refusal dated Nov. 13, 2018, in corresponding JP application No. 2018-550000 (with English Translation, 5 pages).

Decision to Grant a Patent dated Dec. 11, 2018, in corresponding JP application No. 2018-550000 (with English Translation, 5 pages).

Korean Office Action dated Nov. 6, 2019 in Patent Application No. 10-2019-7023917 (with English translation), 10 pages.

Combined Chinese Office Action and Search Report dated Jan. 3, 2020, in Patent Application No. 201780086351.0 (with English translation), 24 pages.

SCINTILLATOR MODULE, SCINTILLATOR SENSOR UNIT, AND SCINTILLATOR MODULE PRODUCTION METHOD

CROSS-REFERENCE TO RELATED APPLICATIONS

This application is a National Stage Application of International Application No. PCT/JP2017/005831, filed Feb. 17, 2017, which designates the United States; the entire contents of which are incorporated herein by reference.

TECHNICAL FIELD

The present invention relates generally to a scintillator module, a scintillator sensor unit, and a method for manufacturing a scintillator module.

BACKGROUND ART

Recently, in medical and industrial X-ray photography, radiation imaging systems incorporating a radiation image sensor have been widely used in place of sensitive films, in view of real-time processing and maintenance and management cost.

Examples of a radiation image sensor applicable to such a radiation imaging system include various kinds of devices, and one of them is a flat panel detector (for example, refer to Patent Document 1).

Scintillator modules including a fiber optic plate (FOP) have been known for use in such a flat panel detector.

For a scintillator module including a fiber optic plate, it is necessary to form, after forming a scintillator layer on the fiber optic plate, a reflective layer by vacuum-depositing of metal such as aluminum for the purpose of reflecting visible light from a radiation incidence side, and to form a moisture-proof coating with a resin layer (for example, parylene polymer) in order to provide a moisture-proof property.

CITATION LIST

Patent Literature

Patent Document 1: Japanese Laid-open Patent Application Publication No. 2002-116258

SUMMARY OF INVENTION

Problem to be Solved by the Invention

However, a sophisticated vacuum deposition apparatus is required to form reflective layers and moisture-proof coatings, which will complicate a manufacturing process and incur increases in production cost.

Moreover, the water vapor transmission rate (WVTR) of the moisture-proof coating of film thickness 20 μm is about 4 g/m²×24 h (=4 g/m²×day) and is definitely not high.

The moisture-proof coating is extremely thin in thickness as described above. It is therefore vulnerable to external impact, which may cause scratches and peel-off thereon, significantly deteriorating the moisture-proof property and leading to degrading the performance of the flat panel detector.

In view of this, an object of the present invention is to provide an easily manufacturable scintillator module which is robust over mechanical impact and can maintain a high moisture-proof property, a scintillator sensor unit, and a method for manufacturing such a scintillator module.

Means for Solving Problem

A scintillator module according to an embodiment includes a moisture-proof welding layer that is formed of a material having a welding property and a moisture-proof property and extends to a side surface of a fiber optic plate to cover, in a sealed state, a scintillator layer and a visible-light reflective layer laminated on the fiber optic plate; and a resin case that covers the moisture-proof welding layer while being pressed against the side surface of the fiber optic plate.

In this case, the resin case may include a face that opposes the moisture-proof welding layer through the visible-light reflective layer, and a peripheral wall of a shape conforming to a periphery of the fiber optic plate.

Further, the peripheral wall of the resin case may extend to a position opposing the fiber optic plate through the moisture-proof welding layer.

Further, the resin case may be formed of a thermoplastic resin.

The resin case may be formed of a crystalline resin

Further, the moisture-proof welding layer may be formed of a butyl-rubber welding material.

A scintillator sensor unit according to one embodiment includes the scintillator module according to any one of the above configurations, and a photodiode array unit that is placed in opposition to the fiber optic plate A method for manufacturing a scintillator module according to one embodiment includes laminating a scintillator layer and a visible-light reflective layer on a fiber optic plate; allowing a resin case to contact and cover a sheet placed on the visible-light reflective layer, the sheet being formed of a material having welding property and a moisture-proof property, the resin case having a lid-like shape and formed of a thermoplastic resin; applying pressure to the resin case toward the fiber optic plate while heating the resin case and the sheet with a mold, and forming a moisture-proof welding layer by extending the sheet to a side surface of the fiber optic plate; and removing the mold and cooling the scintillator module.

DESCRIPTION OF EMBODIMENT

An exemplary embodiment will now be described in detail with reference to the accompanying drawings.

Figure 1:
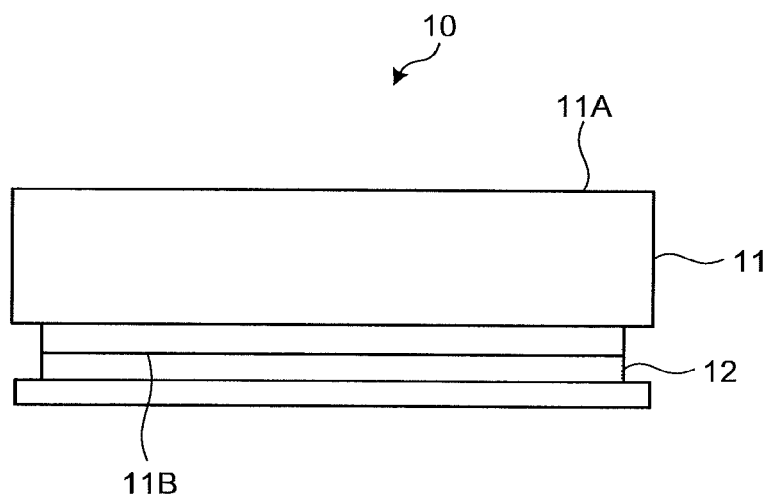
FIG. 1 is a schematic view of the structure of a scintillator sensor unit according to an embodiment.

FIG. 1 is a schematic view of the structure of a scintillator sensor unit according to an embodiment.

A scintillator sensor unit 10 generally includes a scintillator module 11 and a photodiode array unit 12. The scintillator module 11 converts incident radiation (for example, an X-ray) from an incidence surface 11A into visible light, and outputs the visible light from an exit surface 11B. The photodiode array unit 12 receives the visible light converted by the scintillator module 11, and outputs the visible light as image data.

Figure 2:
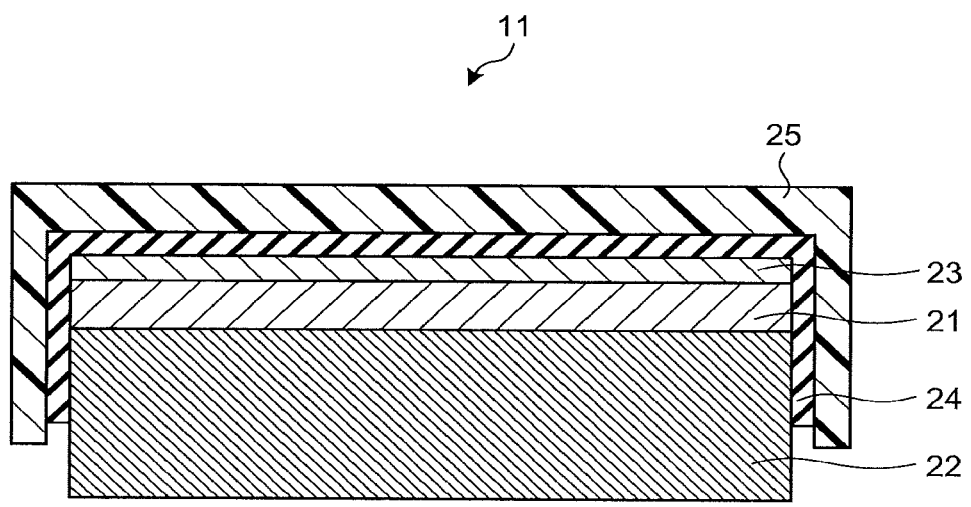
FIG. 2 is a schematic sectional view of the structure of a scintillator module.

FIG. 2 is a schematic sectional view of the structure of the scintillator module.

The scintillator module 11 includes a scintillator layer 21 that converts incident radiation into visible light, a fiber optic plate (FOP) 22 that serves as an optical guide member for guiding the visible light converted by the scintillator layer 21 to the photodiode array unit 12, and a visible-light reflective film layer 23 that is laminated on the scintillator layer 21 and reflects and blocks the incidence of the visible light from the radiation incidence surface 11A, and reflects the visible light, converted by the scintillator layer 21, to the fiber optic plate 22.

The scintillator module 11 further includes a butyl-rubber welding material layer 24 and a resin case (resin cover member) 25. The butyl-rubber welding material layer 24 covers the surface on the incidence surface 11A side and the side surfaces of the visible-light reflective film layer 23, the side surfaces (periphery) of the scintillator layer 21, and part of the side surfaces of the fiber optic plate 22, and contains the scintillator layer 21 and the visible-light reflective film layer 23 in a moisture-proof state with the fiber optic plate 22. The resin case (resin cover member) 25 has a rectangular lid-like shape in a plan view; and opposes the surface of the butyl-rubber welding material layer 24 on the incidence surface 11A side and all the side surfaces of the visible-light reflective film layer 23, the scintillator layer 21, and the fiber optic plate 22 for compression bonding, and maintains the bonding state; and mechanically protects the butyl-rubber welding material layer 24 (moisture-proof welding layer).

In the above structure, the scintillator layer 21 is filmed on the fiber optic plate 22 and is formed from, for example, thallium-activated cesium iodide (CsI(Tl)), sodium-activated cesium iodide (CsI(Na)), or thallium-activated sodium iodide (NaI(Tl)).

The fiber optic plate 22 includes a plate made of a large number of single-mode optical fibers and an absorber glass formed around the single mode optical fibers to absorb leakage of light, and guides incident light directly to the photodiode array unit 12.

The visible-light reflective film layer 23 includes a multi-layer film structure of, for example, a metal thin film such as an aluminum thin film and a polyester resin.

The butyl-rubber welding material layer 24 is made of a material that has a low water vapor transmission rate (such as $<<4$ g/m$^2$×24 h), i.e., a high moisture resistance and viscosity, and can tightly attach to the fiber optic plate 22 and the resin case 25. HX-779BT manufactured by Aika Kogyo Co. Ltd. exemplifies such a material.

The resin case 25 is made of a thermoplastic resin that is easily fabricated and unlikely to block the incidence of radiation. A crystalline resin having a shrinkage ratio of 10/1,000% or more is particularly preferable. Examples thereof include a polyethylene resin (shrinkage ratio of 20/1,000 to 60/1,000%) and a polypropylene resin (shrinkage ratio of 10/1,000 to 25/1,000%).

In view of workability, easy handling, and strength as well as requirements from applications such as limitation to thickness depending on the form of a cassette or an apparatus incorporating the scintillator sensor unit 10, the resin case 25 is set to a thickness of about 0.1 mm to 1.0 mm. However, the thickness of the resin case 25 can be basically optional as long as required strength (and shape as appropriate) for fabrication is ensured.

The resin case 25 of a rectangular lid-like form in a plan view is, for example, formed from these resins by metal molding. The planar-view shape is not limited thereto. The resin case 25 may be of any shape including circular or polygonal as long as the scintillator sensor unit 10 is required to have such a shape.

The butyl-rubber welding material layer 24 described above is susceptible to physical contact and impact because of its viscosity and softness. However, the resin case 25 covers the butyl-rubber welding material layer 24 to reduce influence on the butyl-rubber welding material layer 24.

The manufacturing procedure of the scintillator module of the present embodiment is now described.

Figure 3:
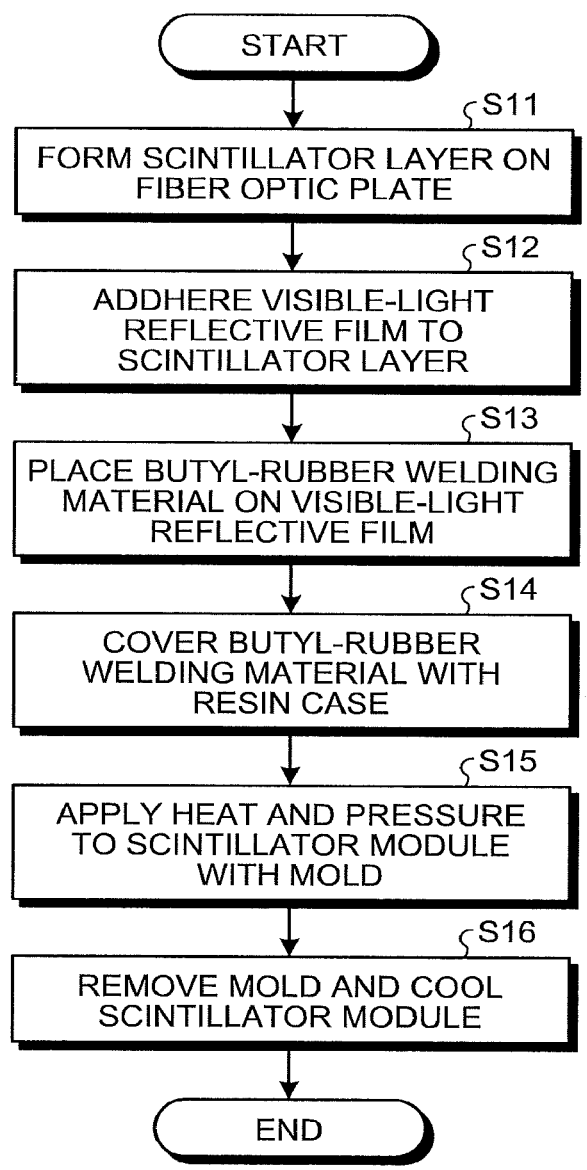
FIG. 3 is a flowchart of the manufacturing procedure of the scintillator module.

FIG. 3 is a flowchart illustrating the manufacturing procedure of the scintillator module.

FIGS. 4A to 4D are explanatory views (Part 1) illustrating the manufacturing procedure of the scintillator module.

Figure 4A:
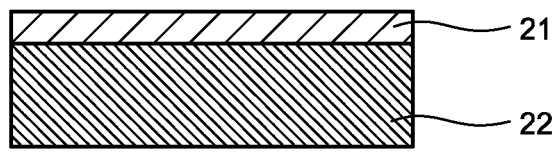
FIGS. 4A to 4D are explanatory views (Part 1) illustrating the manufacturing procedure of the scintillator module.

The scintillator layer 21 is formed on one surface of the rectangular fiber optic plate 22 in a plan view, as illustrated in FIG. 4A (step S11).

Figure 4B:
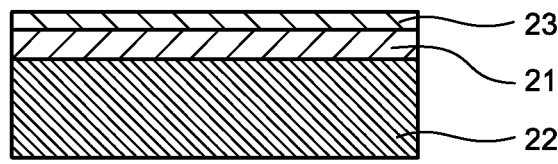

Next, as illustrated in FIG. 4B, a visible-light reflective film is adhered onto the scintillator layer 21 to form the visible-light reflective film layer 23 (step S12).

Figure 4C:
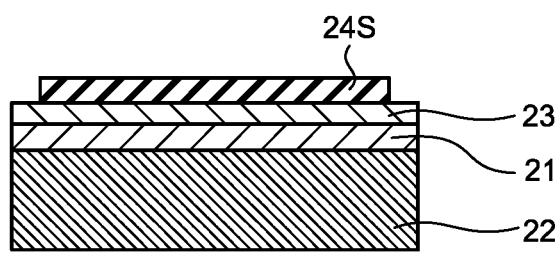
Figure 4D:
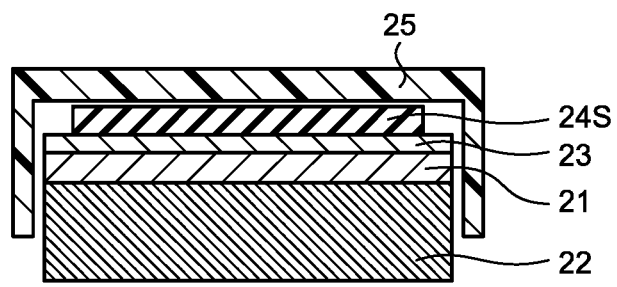

Next, as illustrated in FIG. 4C, a butyl-rubber welding material sheet 24S is placed on the top surface of the visible-light reflective film layer 23 (step S13). As illustrated in FIG. 4D, the butyl-rubber welding material sheet 24S is covered by the resin case 25 (step S14).

In this state, as illustrated in FIG. 4C, the butyl-rubber welding material sheet 24S is merely located on the top surface of the visible-light reflective film layer 23, and does not extend to the side surfaces of the fiber optic plate 22 to accommodate the visible-light reflective film layer 23 and the scintillator layer 21.

Figure 5A:
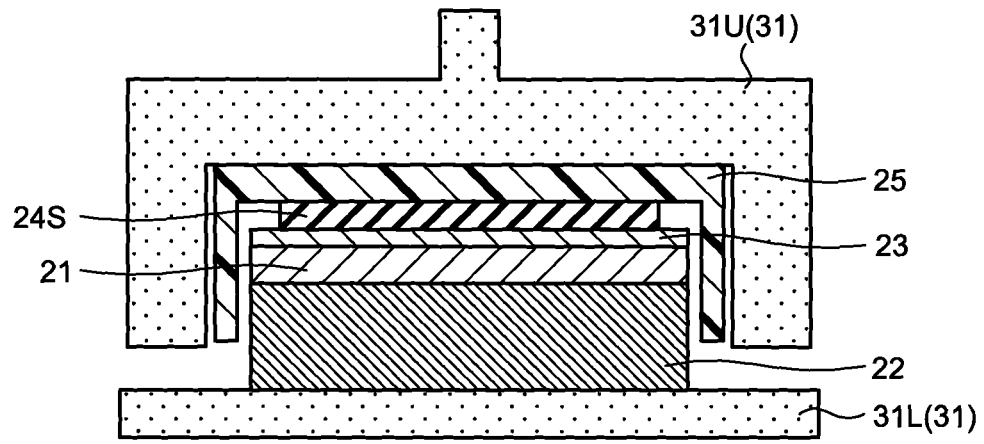
FIGS. 5A to 5C are explanatory views view (Part 2) illustrating the manufacturing procedure of the scintillator module.
Figure 5B:
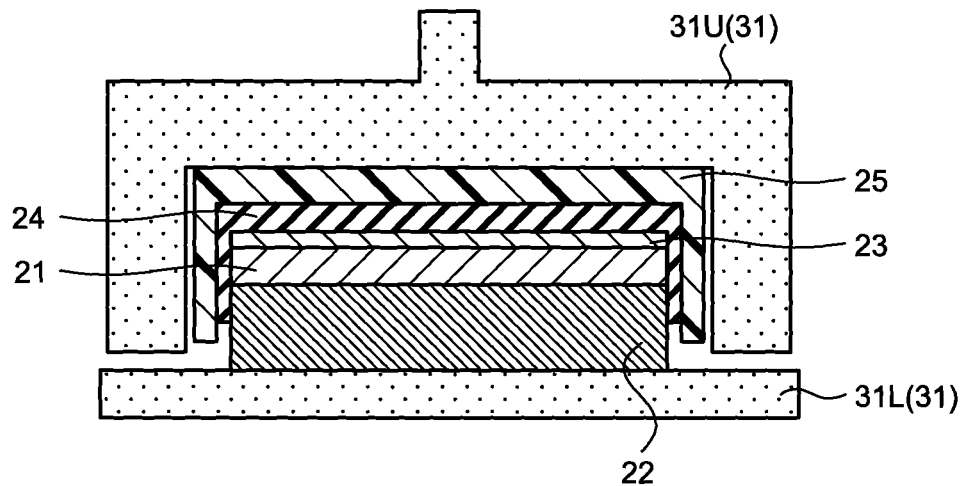
Figure 5C:
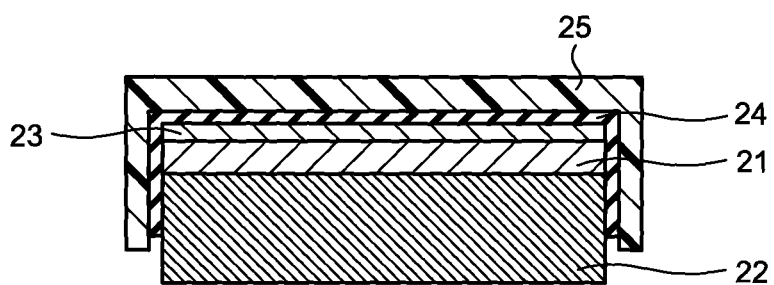

FIGS. 5A to 5C are explanatory views view (Part 2) illustrating the manufacturing procedure of the scintillator module.

Subsequently, as illustrated in FIG. 5A, the mold 31 is brought in contact with the resin case 25 from the top surface side (farther from the fiber optic plate 22) so that a heatable and pressurizable upper mold 31U 31 covers the top and side surfaces of the resin case 25, and that a lower mold 31L supports the fiber optic plate 22. Thereby, the scintillator module is subjected to a heat press process for applying pressure and heat (step S15).

In this case, it is preferable to set the inner dimension of the mold 31 to a certain size, taking the expansion of the resin case 25 while heated into account. This is to prevent the processed butyl-rubber welding material layer 24 from becoming thinner in thickness than necessary and lowering its moisture resistance.

Consequently, the thermoplastic resin case 25 is expanded by heating, and the butyl-rubber welding material sheet 24S is lowered in hardness and becomes highly fluid. As illustrated in FIG. 5B, the butyl-rubber welding material sheet 24S flows in the gap between the resin case 25 and the side surfaces of the visible-light reflective film layer 23, the scintillator layer 21, and the fiber optic plate 22, and covers the incidence surface 11A side and the side surfaces of the visible-light reflective film layer 23, the side surfaces (periphery) of the scintillator layer 21, and part of the side surfaces of the fiber optic plate 22. Thereby, the scintillator layer 21 and the visible-light reflective film layer 23 are accommodated between the fiber optic plate 22 and the butyl-rubber welding material sheet 24S.

In this state, the thermoplastic resin case 25 becomes shrunk by stopping heating with the metal mold 31, removing the mold, and cooling (step S16).

In this manner, the butyl-rubber welding material sheet 24S is welded to the incidence surface 11A side and the side surfaces of the visible-light reflective film layer 23, the side surfaces (periphery) of the scintillator layer 21, and part of the side surfaces of the fiber optic plate 22, forming the butyl-rubber welding material layer 24, as illustrated in FIG. 5C. The scintillator layer 21 and the visible-light reflective film layer 23 are contained in a moisture-proof state between the fiber optic plate 22 and the butyl-rubber welding material layer 24.

In this state, the butyl-rubber welding material layer 24 is compression-bonded between the fiber optic plate 22, which exhibits no change in dimension substantially through heating and cooling, and the resin case 25, which expands by heating and shrinks by cooling. This can ensure the moisture-proof property of the butyl-rubber welding material layer 24 without fail, and physically protect the butyl-rubber welding material layer 24 by the resin case 25.

As described above, the present embodiment enables the moisture-proof protection and packaging of the scintillator module at lower cost without using a sophisticated vacuum deposition apparatus.

In the above, the butyl-rubber welding material sheet 24S being a single sheet has been described. However, in the case of a larger-size scintillator sensor unit 10, the butyl-rubber welding material sheet 24S can be formed by spreading two or more sheets or by spreading two or more butyl-rubber welding material tapes of a certain width to form a sheet as a whole.

In the above, a butyl-rubber welding material is used as a moisture-proof welding layer, however, it is not limited thereto. Any material that exhibits similar property when heated and given pressure is applicable.

Certain embodiments of the present invention have been described, but the embodiments have been presented by way of example only and are not intended to limit the scope of the invention. These novel embodiments may be implemented in a variety of other forms, and various omissions, substitutions, and changes may be made without departing from the spirit of the invention. The accompanying claims and their equivalents are intended to cover these embodiments or modifications as would fall within the scope and spirit of the invention.

The invention claimed is:

1. A scintillator module comprising:
    a moisture-proof welding layer that:
    is formed of a material having a welding property and a moisture-proof property, and extends to a side surface of a fiber optic plate to cover, in a sealed state, a scintillator layer and a visible-light reflective layer laminated on the fiber optic plate; and
        a resin case that covers the moisture-proof welding layer while being pressed against the side surface of the fiber optic plate.

2. The scintillator module according to claim 1, wherein the resin case includes:
    a face that opposes the moisture-proof welding layer through the visible-light reflective layer, and
    a peripheral wall of a shape conforming to a periphery of the fiber optic plate.

3. The scintillator module according to claim 2, wherein the resin case opposes and is fitted to the fiber optic plate through the peripheral wall and the moisture-proof welding layer.

4. The scintillator module according to claim 1, wherein the resin case is formed of a thermoplastic resin with a certain shrinkage ratio or more, so that the resin case, when shrunk, becomes pressed against the moisture-proof welding layer.

5. The scintillator module according to claim 4, wherein the resin case is formed of a crystalline resin with a shrinkage ratio of 10/1,000% or more.

6. The scintillator module according to claim 1, wherein the moisture-proof is formed of a butyl-rubber welding material.

7. A scintillator sensor unit comprising:
    the scintillator module according to claim 1; and
    a photodiode array unit that is placed in opposition to the fiber optic plate.

8. A method for manufacturing a scintillator module comprising:
    forming a material having a welding property and a moisture-proof property into a moisture-proof welding layer that extends to a side surface of a fiber optic plate to cover, in a sealed state, a scintillator layer and a visible-light reflective layer laminated on the fiber optic plate; and
    covering by a resin case, the moisture-proof welding layer while being pressed against the side surface of the fiber optic plate.

* * * * *